(12) United States Patent
Nishioka et al.

(10) Patent No.: US 8,592,314 B2
(45) Date of Patent: *Nov. 26, 2013

(54) POLISHING COMPOSITION AND POLISHING METHOD

(75) Inventors: Ayako Nishioka, Chiba (JP); Yuji Itoh, Chiba (JP); Yoshitomo Shimazu, Shiojiri (JP)

(73) Assignee: Showa Denko K.K., Tokyo (JP)

( * ) Notice: Subject to any disclaimer, the term of this patent is extended or adjusted under 35 U.S.C. 154(b) by 1043 days.

This patent is subject to a terminal disclaimer.

(21) Appl. No.: 11/794,201

(22) PCT Filed: Jan. 24, 2006

(86) PCT No.: PCT/JP2006/301382
§ 371 (c)(1),
(2), (4) Date: Jun. 26, 2007

(87) PCT Pub. No.: WO2006/078074
PCT Pub. Date: Jul. 27, 2006

(65) Prior Publication Data
US 2008/0087644 A1  Apr. 17, 2008

Related U.S. Application Data

(60) Provisional application No. 60/648,707, filed on Feb. 2, 2005.

(30) Foreign Application Priority Data

Jan. 24, 2005  (JP) .................................. 2005-015755

(51) Int. Cl.
*C09G 1/02* (2006.01)
*H01L 21/3105* (2006.01)

(52) U.S. Cl.
USPC .............................. 438/692; 51/307; 252/79.1

(58) Field of Classification Search
USPC ..................... 216/89; 252/79.1–79.2; 51/308; 438/691
See application file for complete search history.

(56) References Cited

U.S. PATENT DOCUMENTS

| 5,047,095 | A * | 9/1991 | Geke et al. ...................... 148/259 |
| 6,355,075 | B1 * | 3/2002 | Ina et al. ......................... 51/308 |
| 6,500,911 | B1 | 12/2002 | Endo et al. |

(Continued)

FOREIGN PATENT DOCUMENTS

| JP | 10-022241 A | 1/1998 |
| JP | 2000-303062 A | 10/2000 |

(Continued)

OTHER PUBLICATIONS

Glab, et al., "pH," Published by Elsevier Ltd., pp. 72-78 (2005).

(Continued)

*Primary Examiner* — Pegah Parvini
(74) *Attorney, Agent, or Firm* — Sughrue Mion, PLLC

(57) ABSTRACT

The present invention aims to provide a polishing composition which allows high-speed polishing of a barrier film and an inter-layer dielectric film along with a wiring metal at the same time, while preventing dishing and erosion, and particularly maintaining the flatness of metal film. The chemical-mechanical polishing composition of the present invention comprises a dicarboxylic acid having 7 to 13 carbon atoms, an oxidizing agent, an abrasive and water.

19 Claims, 2 Drawing Sheets

(56) References Cited

U.S. PATENT DOCUMENTS

| | | | |
|---|---|---|---|
| 6,773,476 B2 * | 8/2004 | Sakai et al. | 51/307 |
| 7,250,369 B1 | 7/2007 | Uchida et al. | |
| 2002/0098697 A1 | 7/2002 | Shimazu et al. | |
| 2002/0139055 A1 | 10/2002 | Asano et al. | |
| 2003/0051413 A1 * | 3/2003 | Sakai et al. | 51/307 |
| 2003/0153183 A1 | 8/2003 | Konno et al. | |
| 2003/0166381 A1 | 9/2003 | Lee et al. | |
| 2004/0152308 A1 | 8/2004 | Minamihaba et al. | |
| 2005/0173669 A1 * | 8/2005 | Kurata et al. | 252/79.1 |
| 2005/0282387 A1 | 12/2005 | Sato et al. | |
| 2006/0032146 A1 * | 2/2006 | Partch et al. | 51/298 |
| 2007/0128872 A1 * | 6/2007 | Itoh et al. | 438/691 |
| 2008/0274620 A1 | 11/2008 | Shida et al. | |

FOREIGN PATENT DOCUMENTS

| | | |
|---|---|---|
| JP | 2000-327760 A | 11/2000 |
| JP | 2001-127027 A | 5/2001 |
| JP | 2001-139937 A | 5/2001 |
| JP | 2001-185514 A | 7/2001 |
| JP | 2001-247853 A | 9/2001 |
| JP | 2002-170790 A | 6/2002 |
| JP | 2002-231666 A | 8/2002 |
| JP | 2003-249468 A | 9/2003 |
| JP | 2003-289055 A | 10/2003 |
| JP | 2004-031905 A | 1/2004 |
| JP | 2004-064061 A | 2/2004 |
| JP | 2004-146840 A | 5/2004 |
| JP | 2004-179294 A | 6/2004 |
| JP | 2004-231748 A | 8/2004 |
| JP | 2004-363141 A | 12/2004 |
| JP | 2004-363574 A | 12/2004 |
| WO | WO 01/04231 A1 | 1/2001 |
| WO | WO 2006/068328 A1 | 6/2006 |

OTHER PUBLICATIONS

Appendix 9, "pH Scale for Aqueous Solutions," CRC Press, Published by Elsevier Ltd., pp. 59-61 (1993).

Japanese Office Action dated Sep. 3, 2013 from the Japanese Patent Office issued in Japanese Patent Application No. 2012-089629.

* cited by examiner (a)

(b)

(c)

POLISHING COMPOSITION AND POLISHING METHOD

CROSS REFERENCE TO RELATED APPLICATIONS

This application is a National Stage of International Application No. PCT/JP2006/301382 filed on Jan. 24, 2006, claiming priority based on Japanese Patent Application No. 2005-015755, filed Jan. 24, 2005, and claiming benefit of U.S. Provisional Application No. 60/648,707, filed Feb. 2, 2005, the contents of all of which are incorporated herein by reference in their entirety.

TECHNICAL FIELD

The present invention relates to a polishing composition for polishing a substrate and, particularly, to a polishing composition for polishing a metal, to a polishing method, and to a method for producing a substrate.

RELATED ART

Technical developments in the field of ICs (integrated circuits) and LSIs (large scale integration circuits) have provided improvements in operating speeds and degrees of integration. For example, recently, the performance of microprocessors and the capacity of memory chips have been improved rapidly. Such improvements have, in large measure, been attained by virtue of developments in micro-processing techniques. One typical example of the micro-processing techniques is a chemical-mechanical polishing process, which is a planarization technique. A chemical-mechanical polishing process is employed in planarization of an inter-layer dielectric film, a metal plug, metal wiring, etc. during multi-layer wiring steps.

Among wiring metals, in recent years, copper or a copper alloy has been employed so as to prevent a problem of wiring delay. Such copper or copper-alloy wiring is produced by forming trenches in an inter-layer dielectric film in advance, forming a thin barrier film to prevent diffusion of copper into the inter-layer dielectric film, and depositing copper or copper alloy through a technique such as the damascene process. According to the above process, excess copper or copper alloy remains on the inter-layer dielectric film. Thus, the wiring is produced by removing the excess copper or copper alloy through polishing for planarization.

Meanwhile, a magnetic random access memory (MRAM) is one example of magnetic recording media of interest. Regarding MRAM, a method for recording information to a specific bit of the element array has been known. In the method, a bit-writing-in line and a word-writing-in line, which cross with each other and respectively extending in the lengthwise and widthwise directions, are provided, and information is written exclusively in a specific bit located in the region where the two lines cross each other (see, for example, Japanese Unexamined Patent Publication (Kokai) No. 10-116490). The metal wiring used for the MRAM consists of a conductor layer composed of aluminum or an aluminum alloy, or copper or a copper alloy; a ferromagnetic layer composed of nickel-iron (e.g. Permalloy), etc. and surrounding the conductor layer; and thin barrier films composed of tantalum, tantalum nitride, etc. and sandwiching the ferromagnetic layer. The metal wiring is formed through the damascene process, and excess portions of the conductor layer, the ferromagnetic layer and the barrier film are removed through polishing to provide a plane surface.

The barrier film is formed as a layer underlying the copper, the copper alloy or the like of the wiring so as to prevent diffusion of copper into the inter-layer dielectric film. As for the barrier layer, for example, tantalum, a tantalum alloy and a tantalum compound such as tantalum nitride is used. The barrier layer on the inter-layer dielectric film other than the wiring portion must be removed by polishing. The polishing of the barrier film is important because it affects the final properties of the copper wiring, and must be performed without causing loss of copper wiring, generation of polishing scratches, or the like.

In order to enhance the production efficiency of a semiconductor device, a high removal rate for copper and the barrier film is demanded. However, the metal used for the barrier film has a hardness higher than that of copper, and therefore it is difficult for the metal to be polished and removed at the same speed as copper.

When there is a difference in the removal rate between copper and the barrier film, this brings about a dishing phenomenon wherein an excavated portion is formed in the copper buried in a trench surrounded by a barrier metal, as a result, an increase in wiring resistance or a short circuit of the wiring occurs and the reliability decreases.

Furthermore, the width of wiring tends to be narrower. In the case where fine wiring lines are located at a high density, there arises a phenomenon called erosion wherein a barrier film and an inter-layer dielectric film are over-polished to form an excavated portion. Similarly to dishing, the erosion gives rise to an increase in wiring resistance or a short circuit of the wiring. Therefore, the prevention of erosion is demanded.

Generally, a semiconductor device such as IC, LSI and like has various patterns, having different wiring widths, on one substrate surface. A high density patterned part having a small wiring width tends to provide little dishing, but suffer much erosion. On the other hand, a patterned part having a large wiring width tends to provide little erosion, but suffer much dishing. It is desirable to minimize both dishing and erosion in order to improve the flatness of a surface.

As for the metal polishing composition capable of polishing a metal film comprising copper or a copper alloy, while preventing a phenomenon such as dishing or erosion, for example, Japanese Unexamined Patent Publication (Kokai) No. 8-83780 discloses a composition comprising hydrogen peroxide, benzotriazole and aminoacetic acid and, if desired, further comprising abrasive grains. It is stated that the benzotriazole reacts with an oxidized metal film to form a protective film, and thereby allows for preferential mechanical polishing of the protruded portion to enhance the flatness and contributes to little dishing.

The barrier film has a high hardness as compared with copper or a copper alloy, and greatly differs in chemical properties from copper. Accordingly, by using such a combination of the polishing materials used for copper or a copper alloy, a sufficiently high removal rate of the barrier layer is not obtained, in many cases.

In order to solve this problem, a two-step polishing method comprising a first step of polishing copper or a copper alloy at a high speed and a second step of polishing a barrier layer is being studied.

In the second step of polishing a barrier film, for the purpose of eliminating the level difference generated in the first step or removing the cap layer of low-k film, polishing of an inter-layer dielectric film is sometimes required as well as polishing of the barrier film.

Furthermore, in a process for an upper layer of a multi level interconnection, copper or a copper alloy may partially remain at the parts other than wiring parts after the first step because of uniformity and flatness fluctuate due to fine level difference or accumulation of non-uniformity in a process for lower layers. Therefore, in the second step, the remaining copper or copper alloy as well as the barrier layer must be polished.

In order to make the polished surface flat when an inter-layer dielectric film is entirely exposed, a technique of polishing a barrier layer, a metal in the wiring portion and an inter-layer dielectric film while keeping the surface flatness by setting the removal rate for a barrier layer or a metal in the wiring portion and the removal rate for an inter-layer dielectric film to be almost equal, has been proposed (Japanese Unexamined Patent Publication (Kokai) No. 2001-196336).

Japanese Patent No. 2819196 discloses a technique of suppressing the removal rate for silicon dioxide by using a polishing composition comprising a compound having two acidic groups.

Japanese Patent No. 3450247 discloses a method of polishing a barrier film by using a silica abrasive and a carboxylic acid having a specific structural formula, and this accordingly does not refer to the polishing activity for an inter-layer dielectric film.

Japanese Unexamined Patent Publication (Kokai) No. 2004-179294 discloses a polishing liquid comprising at least one component selected from the group consisting of aromatic sulfonic acids and salts thereof, at least one component selected from the group consisting of aromatic carboxylic acids and salts thereof, and water. This document describes that the polishing liquid can polish an inter-layer dielectric film material such as silicon dioxide, a wiring material such as copper, and a barrier film material such as tantalum at a similar removal rate without erosion.

Japanese Unexamined Patent Publication (Kokai) No. 2002-294225 discloses a polishing composition for a surface polishing of a magnetic disc substrate such as a Ni—P disc. The polishing composition comprises water, silicon dioxide, an oxidizing agent, and at least one organic acid selected from the group consisting of malic acid, maleic acid, lactic acid, acetic acid, citric acid, succinic acid, malonic acid, glycolic acid, adipic acid, ascorbic acid, itaconic acid, iminodiacetic acid, glyoxylic acid, formic acid, acrylic acid, crotonic acid, nicotinic acid, citraconic acid and tartaric acid; and has a pH of at least 1 and less than 7.

DISCLOSURE OF THE INVENTION

An object of the present invention is to provide a polishing composition which allows high-speed polishing of a barrier film and an inter-layer dielectric film along with a wiring metal at the same time, while preventing dishing and erosion, and particularly maintaining the flatness of metal film. Another object of the invention is to provide a method for polishing a substrate by use of the polishing composition.

As a result of intensive investigations to solve those problems, the present inventors have found that a chemical-mechanical polishing composition can preferably achieve the above-described objects in a wide pH range, the chemical-mechanical polishing composition comprising a dicarboxylic acid having 7 to 13 carbon atoms, an oxidizing agent, an abrasive and water. That is, the present invention is as follows.

(1) A chemical-mechanical polishing composition comprising a dicarboxylic acid having 7 to 13 carbon atoms, an oxidizing agent, an abrasive and water.

(2) The chemical-mechanical polishing composition as described in (1) above, wherein the dicarboxylic acid is an aliphatic dicarboxylic acid.

(3) The chemical-mechanical polishing composition as described in (1) or (2) above, wherein the dicarboxylic acid is a dicarboxylic acid which does not have a hydroxyl group.

(4) The chemical-mechanical polishing composition as described in any one of (1) to (3) above, wherein the dicarboxylic acid is 3-methyladipic acid, pimelic acid, sebacic acid, tridecanedioic acid, or mixtures thereof.

(5) The chemical-mechanical polishing composition as described in any one of (1) to (4) above, wherein the oxidizing agent is hydrogen peroxide.

(6) The chemical-mechanical polishing composition as described in any one of (1) to (5) above, wherein the abrasive is a colloidal silica.

(7) The chemical-mechanical polishing composition as described in any one of (1) to (6) above, wherein the composition comprises one or more additional acids.

(8) The chemical-mechanical polishing composition as described in (7) above, the additional acid is selected from the group consisting of a sulfonic acid, a carboxylic acid, an amino acid, sulfuric acid, a phosphoric acid, a phosphonic acid, and nitric acid.

(9) The chemical-mechanical polishing composition as described in any one of (1) to (8) above, wherein the composition comprises one or more alkali metal ions.

(10) The chemical-mechanical polishing composition as described in any one of (1) to (6) and (9) above, wherein the composition may comprise an alkali metal ion, and exclusively comprises, as the contents other than the alkali metal ion, a dicarboxylic acid having 7 to 13 carbon atoms, an oxidizing agent, an abrasive and water.

(11) The chemical-mechanical polishing composition as described in (9) or (10) above, wherein the alkali metal ion is potassium ion.

(12) The chemical-mechanical polishing composition as described in any one of (1) to (11) above, wherein the content of the dicarboxylic acid is from 0.005 to 10 mass % based on the chemical-mechanical polishing composition.

(13) The chemical-mechanical polishing composition as described in any one of (1) to (12) above, wherein the content of the oxidizing agent is from 0.01 to 30 mass % based on the chemical-mechanical polishing composition.

(14) The chemical-mechanical polishing composition as described in any one of (1) to (13) above, wherein the content of the abrasive is 30 mass % or less based on the chemical-mechanical polishing composition.

(15) The chemical-mechanical polishing composition as described in any one of (1) to (14) above, wherein the pH is from 2 to 4.

(16) The chemical-mechanical polishing composition as described in any one of (1) to (14) above, wherein the pH is from 8 to 12.

(17) The chemical-mechanical polishing composition as described in (7) or (8) above, wherein the content of the additional acid is 0.1 mass % or less based on the chemical-mechanical polishing composition.

(18) A method for polishing a substrate, wherein the method comprises planarizing a substrate by using the chemical-mechanical polishing composition described in any one of (1) to (17) above, the substrate comprising an insulating film having a trench, a barrier film formed on the insulating film, and a wiring material film buried in the trench and covering the barrier film.

(19) The polishing method as described in (18) above, wherein the wiring material is copper or a copper alloy.

(20) The polishing method as described in (18) or (19) above, wherein the insulating film is a film of an inorganic silicon compound or an organic compound.

(21) The polishing method as described in (20) above, wherein the inorganic silicon compound is at least one material selected from the group consisting of $SiO_2$, SiN, SiNO, SiOC, SiCN and mixtures thereof.

(22) The polishing method as described in any one of (18) to (21) above, wherein the barrier film is a film of at least one material selected from the group consisting of tantalum, a tantalum alloy, a tantalum compound and mixtures thereof.

(23) A composition which provides the chemical-mechanical polishing composition described in any one of (12) to (17) above when the composition is diluted with water.

(24) A method for transporting or storing a chemical-mechanical polishing composition, wherein the method comprises using the composition described in (23) above.

(25) A kit comprising a plurality of compositions, wherein the plurality of compositions provides the chemical-mechanical polishing composition described in any one of (1) to (17) above when plurality of compositions are mixed together or when plurality of compositions are mixed together and diluted with water.

(26) A method for transporting or storing a chemical-mechanical polishing composition, wherein the method comprises using the kit described in (25) above.

EFFECTS OF THE INVENTION

According to the chemical-mechanical polishing composition of the present invention comprising a dicarboxylic acid having 7 to 13 carbon atoms, an oxidizing agent, an abrasive and water, a barrier film and an inter-layer dielectric film can be simultaneously polished along with a wiring metal at a high speed in a wide pH range, while suppressing dishing and erosion and maintaining the flatness.

Also, when an additional acid is incorporated into the chemical-mechanical polishing composition of the present invention, the removal rate for a metal such as copper can be optionally increased while maintaining good property of the polishing composition of the present invention of ensuring high-speed planar polishing, such that the ratio of removal rates for an inter-layer dielectric film, a barrier film and a wiring metal can be controlled. Furthermore, according to the polishing method using the polishing composition of the present invention, production of a substrate with excellent flatness can be facilitated.

BEST MODE FOR CARRYING OUT THE INVENTION

Figure 1:
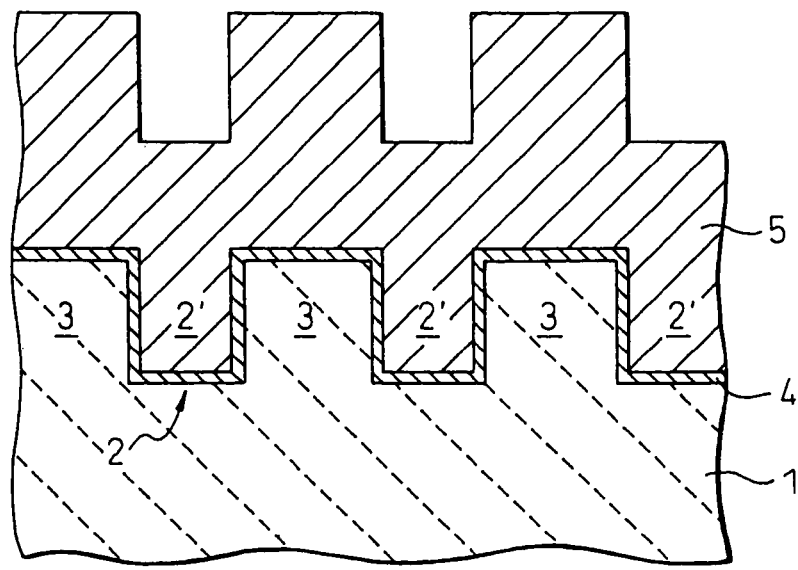
FIG. 1(a) is a transverse cross-sectional view showing a pattern wafer.
FIG. 1(b) is a transverse cross-sectional view showing a substrate sample.
FIG. 1(c) is a transverse cross-sectional view showing a polished substrate sample.
Figure 1:
Figure 1:
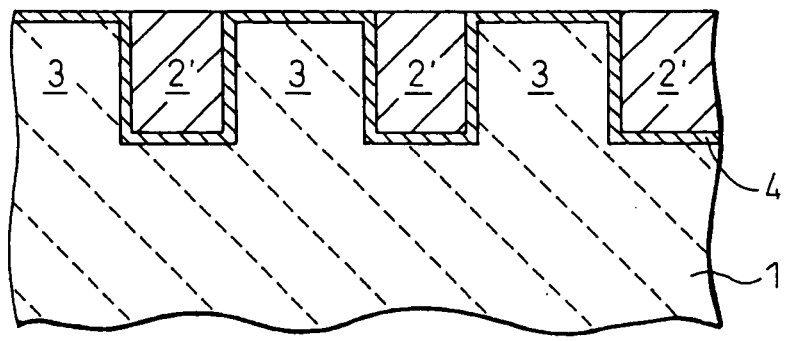
Figure 1:
Figure 1:
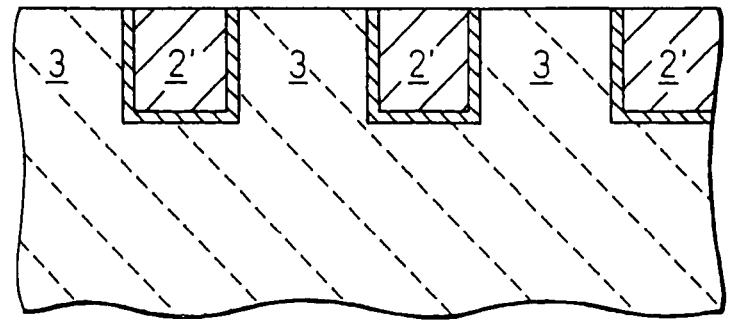

The embodiment of the present invention is described in detail below.

The present invention relates to a polishing composition which can be preferably used for planarizing a metal film which covers a substrate having a trench to be buried in the trench.

The chemical-mechanical polishing composition of the present invention comprises a dicarboxylic acid, an oxidizing agent, an abrasive and water. The chemical-mechanical polishing composition of the present invention can optionally comprise an additional acid or an alkali alkaline metal ion.

<Dicarboxylic Acid>

The dicarboxylic acid used for the polishing composition of the present invention is a compound having two carboxylic groups in one molecular; may have a cyclic structure, an unsaturated bond and branched chain structure; and is preferably an aliphatic dicarboxylic acid, more preferably a normal chain saturated dicarboxylic acid. A mixture of two or more dicarboxylic acid may also be used.

The dicarboxylic acid used for the polishing composition of the present invention has 7 to 13 carbon atoms, such as 8 to 13 carbon atoms, and includes 3-methyladipic acid, pimelic acid, suberic acid, azelaic acid, sebacic acid, dodecanedioic acid, tridecanedioic acid.

The dicarboxylic acid used for the polishing composition of the present invention may be a mixture of above dicarboxylic acids.

The dicarboxylic acid used for the polishing composition of the present invention preferably does not have a hydroxyl group.

If a dicarboxylic acid used has an excessively small carbon atom number or has hydroxyl group, it becomes difficult to prevent dishing since such a dicarboxylic acid promotes polishing of copper or copper alloy than that of a barrier film. When such a dicarboxylic acid is used in a polishing composition, dishing and erosion can not be sufficiently prevented even if the content of the dicarboxylic acid is adjusted such that the removal rate for copper of a blanket wafer with copper film becomes relatively small.

If a dicarboxylic acid used has an excessively large carbon atom number, it becomes difficult to provide a flat substrate surface since such a dicarboxylic acid inhibits polishing of copper or a copper alloy too much to provide the proper relative removal rates for an inter-layer dielectric film, a barrier film and a wiring metal. Also, such a dicarboxylic acid does not have sufficient solubility in an acidic polishing composition, and therefore can not provide an appropriate removal rate.

For example, the content of the dicarboxylic acid is preferably from 0.005 to 10 mass %, more preferably from 0.01 to 5 mass %, and particularly preferably 0.03 to 1.5 mass % based on the polishing composition. If the content of the dicarboxylic acid is not enough, an appropriate removal rate for a metal film and an inter-layer dielectric film may not be obtained. On the other hand, if the content is excessive, the removal rate for copper or a copper alloy may become excessively high or, depending on the case, the solution may not be stable.

<Oxidizing Agent>

The oxidizing agent used for the polishing composition of the present invention oxidizes a metal or a metal alloy, and contributes to elevation of the removal rate. Examples of the aforementioned oxidizing agent include oxygen, ozone, hydrogen peroxide, alkyl peroxides (e.g. t-butyl hydroperoxide and ethylbenzene hydroperoxide), peracids (e.g. peracetic acid and perbenzoic acid), permanganate salts (e.g. potassium permanganate), periodate salt (e.g. potassium periodate), persulfate salts (e.g. ammonium persulfate and potassium persulfate), a polyoxo acid, and hypochlorite salts (e.g. potassium hypochlorite). Among these oxidizing agents, hydrogen peroxide, persulfate salts and hypochlorites, which can be simply handled, are preferred. In particular, hydrogen peroxide is preferred.

The amount of the oxidizing agent is not particularly specified because a different appropriate range exists for each case depending on metals to be polished or a pH of the solution or the like. However, it is preferably used in an amount of 0.01 to 30 mass %, more preferably 0.05 to 20 mass %, still more preferably 0.1 to 10 mass % with respect to the polishing composition. When the amount is excessively small or large, it may be possibly difficult to attain a sufficient removal rate.

Use of excess amount is economically disadvantage.

<Abrasive>

The abrasive used for the polishing composition of the present invention includes silica, cerium oxide, aluminum oxide, aluminum hydroxide, titanium dioxide, organic abrasive. In order to prevent generation of scratch, an abrasive having a small particle size, no sharp edge and a near spherical shape is preferable, and especially use of silica, particularly colloidal silica is desirable. The abrasive may consist of only one kind of abrasive, and may be a mixture of two or more abrasives. The primary particle size of the abrasive is preferably 70 nm or less, and more preferably 40 nm or less.

The amount the abrasive contained is generally 30 mass % or less, preferably 20 mass % or less, more preferably 10 mass % or less, based on the polishing composition. If the amount contained is excessively large, this gives rise to progress of dishing or increase of scratches. Also, in view of planarization, the amount contained of the abrasive is preferably 0.1 mass % or more based on the polishing composition.

<pH>

The chemical-mechanical polishing composition of the present invention may be preferably used in a wide pH range, particularly in the pH range of from 2 to 4 or from 8 to 12.

<Other Contents>

The polishing composition of the present invention may optionally comprise an additional acid or salt thereof, and/or an alkali metal ion. The additional acid includes one or more component selected from the group consisting of a organic acid (e.g. a carboxylic acid, a sulfonic acid and an amino acid), and an inorganic acid (e.g. sulfuric acid, a phosphoric acid, a phosphonic acid, hydrochloric acid and nitric acid).

It is possible to increase a removal rate for metal such as copper in order to adjust the relative removal rates of a wiring metal, a barrier metal and an inter-layer dielectric film, by adding, into the polishing composition of the present invention, an additional acid selected from the group consisting of an organic acid (e.g. as a sulfonic acid, a carboxylic acid and an amino acid), and an inorganic acid (e.g. sulfuric acid, a phosphoric acid, a phosphonic acid and nitric acid). These compounds have a property of water-solubilizing metal oxides, and it is desirable to add them in a small amount which can maintain a preferable polishing property of the polishing composition, generally in an amount of 0.1 mass % or less.

A sulfonic acid, which may be contained in the polishing composition of the present invention, has one or more sulfonyl groups in the molecular structure thereof, and may have a cyclic structure, an unsaturated bond, a branched structure, ether bond, hydroxyl group, amino group and carboxylic group.

The sulfonic acid includes methanesulfonic acid, ethanesulfonic acid, methanedisulfonic acid, 1,2-ethanedisulfonic acid, isethionic acid, sulfoacetic acid, taurine, benzenesulfonic acid, toluenesulfonic acid, alkylbenzenesulfonic acid wherein the alkyl group has 2 to 6 carbon atoms, xylenesulfonic acid, naphtalenesulfonic acid, anthraquinonesulfonic acid, benzenedisulfonic acid, sulfobenzoic acid, phenolsulfonic acid, and aminosulfonic acid. The preferable sulfonic acid includes methanesulfonic acid, ethanesulfonic acid, benzenesulfonic acid, toluenesulfonic acid, and xylenesulfonic acid.

Incidentally, an alkylbenzenesulfonic acid wherein the alkyl group has 6 or more carbon atoms works as a surfactant to inhibit polishing of a metal or metal alloy. An additive such as a surfactant providing this inhibiting effect is preferably not contained in the polishing composition of the present invention. An acceptable content of an additive such as a surfactant providing this inhibiting effect is not determined definitively since the acceptable content depends on the inhibiting ability of the additive. However, such an additive contained in the amount of less than 0.005 mass % generally does not degrade the performance of the polishing composition of the present invention very much.

A carboxylic acid, which may be contained in the polishing composition of the present invention, is any acid having a carboxylic group in the molecular structure thereof, and may have hydroxyl group, and may be a polymer.

The carboxylic acid includes formic acid, acetic acid, propionic acid, lactic acid, butyric acid, valeric acid, 2-methylbytyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, malic acid, citric acid, lactic acid, polyacrylic acid and like, and salts thereof.

An amino acid, which may be contained in the polishing composition of the present invention, includes glycine, alanine, $\beta$-alanine, 2-aminobutyric acid, norvaline, valine, leucine, norleucine, isoleucine, allo-isoleucine, phenylalanine, proline, sarcosine, ornithine, lysine, serine, threonine, allo-threonine, homoserine, tyrosine, 3,5-diiodo-tyrosine, $\beta$-(3,4-dihydroxyphenyl)-alanine, thyroxine, 4-hydroxy-proline, cysteine, methionine, ethionine, lanthionine, cystathionine, cystine, cysteic acid, asparagic acid, glutamic acid, S-(carboxymethyl)-cysteine, 4-aminobutyric acid, asparagine, glutamine, azaserine, arginine, canavanine, citrulline, $\delta$-hydroxy-lysine, creatine, kynurenine, histidine, 1-methyl-histidine, 3-methylhistidine, ergothioneine and tryptophan, and salts thereof.

The polishing composition of the present invention may comprise one or more above acids.

Alkali Metal Ion

An alkali metal ion, which may be contained in the polishing composition of the present invention, is any alkali metal ion, preferably potassium ion. The alkali metal ion may be supplied from any compound, and may be supplied, for example, from sodium hydroxide, potassium hydroxide, potassium carbonate or potassium bicarbonate, preferably from potassium hydroxide. When the pH of the polishing composition of the present invention is adjusted, a hydroxide is preferably used because the pH of the polishing composition of the present invention can be easily adjusted.

Although any amount of an alkali metal ion can be used, it is preferable for the pH of the polishing composition of the present invention to be adjusted to 2 to 12 by adding or not adding an alkali metal ion. The pH of the polishing composition of the present invention is preferably adjusted to a pH other than the vicinity of the isoelectric point of the abrasive used. Especially, when a silica abrasive is used as an abrasive, the pH of the polishing composition of the present invention is desirably adjusted to a pH of form 2 to 4 or from 8 to 11.

When the amount of an alkali metal ion contained is excess, the removal rate for copper and a copper alloy may become large such that dishing is enhanced to make planarization difficult. When the pH of the polishing composition of the present invention is more than 12, it may be difficult to obtain stability of the liquid.

It is possible for the polishing composition of the present invention to further comprise an additive such as an anti-mold agent and dispersant, and/or an organic solvent such as ethanol and isopropanol, as long as it does not degrade the performance for removal rate or flatness provided by the polishing composition of the present invention.

<Subject to be Polished>

The subject to be preferably polished by use of the polishing composition of the present invention includes a metal and an insulating film. The polishing composition of the present invention can preferably be used either for polishing all or a part of the subject to be polished.

Concrete Examples of the preferable metals to be polished include aluminum, copper, iron, tungsten, nickel, tantalum, a platinum group metal (e.g. ruthenium, platinum), and alloys thereof. More preferably, the polishing composition of the present invention can be used for a wiring metal film which will form a wiring part of a multi-layer wiring part, and a barrier film which is formed between the wiring metal film and a substrate. Even more preferably, the polishing composition of the present invention can be used for a copper, copper alloy, iron, iron alloy, etc. which will form a wiring part of a multi-layer wiring part; and a tantalum, tantalum alloy, tantalum compound such as tantalum nitride, titanium, titanium alloy, etc. which is a barrier film.

The insulating film includes one generally used as an inter-layer dielectric film or a cap layer. A compound forming an insulating film includes an inorganic silicon compound containing a large amount of silicon (e.g. silicon oxide ($SiO_2$), SiN, SiNO, SiOC, SiCN, hydroxysilsesquioxane (HSQ) or methylsilsesquioxane (MSQ), an organic compound (e.g. benzocyclobutene); and mixtures thereof. An insulating film may be laminated layers of these compounds, or a low-dielectric-constant insulating film comprising pores dispersed therein.

<Polishing Method>

In the polishing method using the polishing composition of the present invention, a substrate having a film to be polished is pressed against a polishing pad on a platen. While the polishing composition of the present invention is fed between the polishing pad and the substrate, relative movement between the platen and the substrate is effected, thereby polishing the metal film to be polished. In this case, a conventional polishing machine having a holder for holding a semiconductor substrate and a platen onto which a polishing pad is affixed may be employed.

The linear speed obtained by rotating the platen while forcing a substrate against a polishing pad varies considerably depending on the structure of the polishing machine employed. For example, it is possible to employ a linear speed of 10 to 500 m/min, preferably 20 to 300 m/min, more preferably 30 to 150 m/min to perform the polishing. In order to perform uniform polishing of the substrate through rotation of the platen, the substrate must be rotated. The substrate is rotated at a speed almost equal to that of the platen and, in some cases, the rotation number of the substrate may be slightly increased or decreased so as to accomplish uniform polishing.

The substrate is pressed against the polishing pad by means of a holder. The pressure may be preferably 0.1 to 100 kPa. The pressure cannot be predetermined definitively, because when the rotation speed of the platen is high, the pressure may be prone to decrease. However, the pressure is preferably 0.5 to 80 kPa, more preferably 1 to 50 kPa. These polishing conditions may be changed in the course of polishing. For example, the rotation speeds of the platen and polishing pad may be increased or decreased halfway through the polishing time.

The polishing pad employed in the present invention is generally made of unwoven fabric or polyurethane foam. Many polishing pads have grooves so as to accelerate polishing and to facilitate discharge of a polishing slurry. Examples of such grooved polishing pads include a polishing pad having grooves in the lengthwise and widthwise directions (XY groove), and a polishing pad having concentric grooves (K groove). The polishing composition of the present invention is applicable to any of these polishing pads. Polishing pads are generally dressed by means of a diamond dresser so as to prevent clogging and to perform stable polishing. In the present invention, any conventionally known dressing method may be employed.

The chemical-mechanical polishing composition used in the present invention may be used at a temperature of 0 to 100° C. The polishing composition of the present invention is, in general, preferably used at about room temperature. However, the temperature of the polishing composition may be adjusted, e.g. to control a removal rate. When the temperature is too low, the removal rate cannot be increased, and the polishing liquid may be solidified at a temperature below 0° C. On the other hand, when the temperature is excessively high, there is a possibility that an undesired side reaction may occur. The temperature is preferably 10 to 50° C., and more preferably 15 to 40° C.

The amount of the polishing composition supplied to a polishing machine is determined in accordance with the sizes of the polishing machine and the wafer to be polished. When an 8-inch wafer is polished, an amount of 10 to 1,000 mL/min may be preferably employed. The amount is more preferably 50 to 500 mL/min, still more preferably 100 to 400 mL/min. The amount of the composition supplied may be changed in the course of polishing. For example, the amount of the composition supplied may be increased or decreased halfway through the polishing time.

The polishing composition of the present invention may be continuously supplied onto the polishing pad on the platen by use of a pump or a similar apparatus. The polishing composition to be supplied may be in the form of a single liquid containing all ingredients. Alternatively, the composition may be supplied in a divided manner in the form of a plurality of liquid components in separate lines, in consideration of the stability of the polishing liquid. For example, an oxidizing agent solution such as hydrogen peroxide solution and other solutions may be respectively supplied in separate lines; and a polishing solution composed mainly of abrasive and the other solutions may be respectively supplied in separate lines.

In these cases, the divided solutions may be combined to form a single solution just before supplying to a polishing pad. In such a case, a plurality of lines may be connected to a single line, or a mixing device such as a reservoir for mixing a plurality of polishing solutions may be used. Alternatively, respective polishing solutions may be supplied through separate lines to a polishing pad. The flow rates of respective solutions may be changed in the course of polishing. For example, when a combination of two solutions are used, the flow rate of one of the two solutions is increased or decreased halfway through the polishing time.

A substrate having the metal film planarized can be produced by such a polishing method. This step is described by referring to a method of forming wiring on a device, below.

A trench and an opening for forming wiring are formed in an inter-layer dielectric film on a substrate, and a thin barrier film is formed on the inter-layer dielectric film. Furthermore, a metal film for metal wiring, such as copper, is formed by plating or the like to fill the trench and opening. This metal film is polished, and the exposed barrier film and inter-layer dielectric film are then polished for planarization, thereby a substrate comprising a planarized metal film can be produced.

The polishing solution of the present invention can be applied to the chemical-mechanical polishing of a metal film and a barrier film for metal wiring, and that of an inter-layer dielectric film. Preferably, in a two-stage polishing method comprising a first step of polishing copper or a copper alloy at a high speed, and a second step of polishing a barrier film, the polishing solution of the present invention is effective for the polishing in the second step.

The polishing composition of the present invention may be stored in the form of a plurality of separate compositions during transportation or storage, considering convenience of handling, such as stability of solutions. For example, the polishing composition may be divided into an oxidant solution and a remaining solution. The polishing composition may be divided into a solution mainly composed of the abrasive and a remaining solution. Also, the polishing composition may be prepared as a thicker composition condensed than when used, which is used after diluting with water, etc. to a concentration appropriate for polishing.

EXAMPLES

The present invention is described in greater detail below by referring to Examples 1 to 12 and Comparative Examples 1 to 6, but the present invention is not limited to these Examples in any way.
<Wafer>
The wafers used here are as follows.
Blanket Wafer with Tantalum Film
A silicon wafer uniformly lined with a tantalum film.
Blanket Wafer with Copper Film
A silicon wafer wherein the tantalum film of the blanket wafer with a tantalum film is uniformly lined with a copper film.
Blanket Wafer with Silicon Oxide Film:
A silicon wafer uniformly lined with a silicon oxide film formed by CVD.
Substrate Sample:
A silicon wafer 1 for the formation of a copper wiring pattern was provided, the silicon wafer having a trench 2 depth of 500 nm and the line 2'/space 3 of 100 μm/100 μm (or 9 μm/1 μm). A 25 nm-thick tantalum barrier film 4 was formed on the silicon wafer 1 for the formation of a copper wiring pattern, and a 1,000 nm-thick copper film 5 was formed on the entire surface thereof to obtain a pattern wafer shown in FIG. 1(a). This pattern wafer was polished by using a copper or copper alloy polishing solution having a sufficiently high removal rate for copper as compared with tantalum to give a dishing amount of 50 nm or less in the state of the barrier layer being exposed on the insulating film part. In this way, a substrate sample shown in FIG. 1(b) was prepared.

Figure 2:
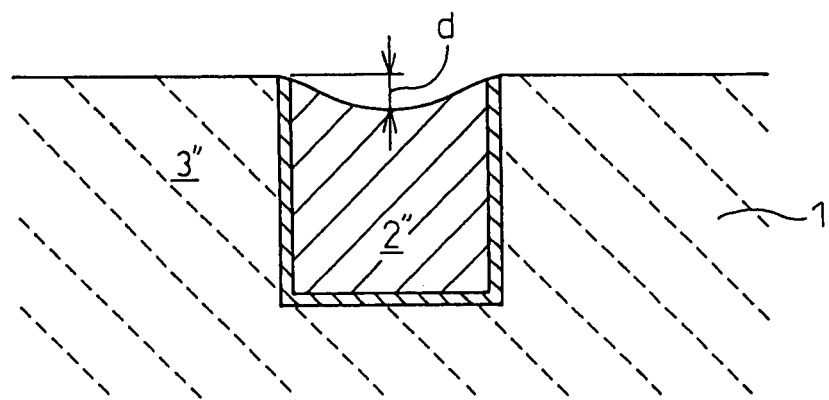
FIG. 2 is a transverse cross-sectional view showing dishing of a wafer.
Figure 3:
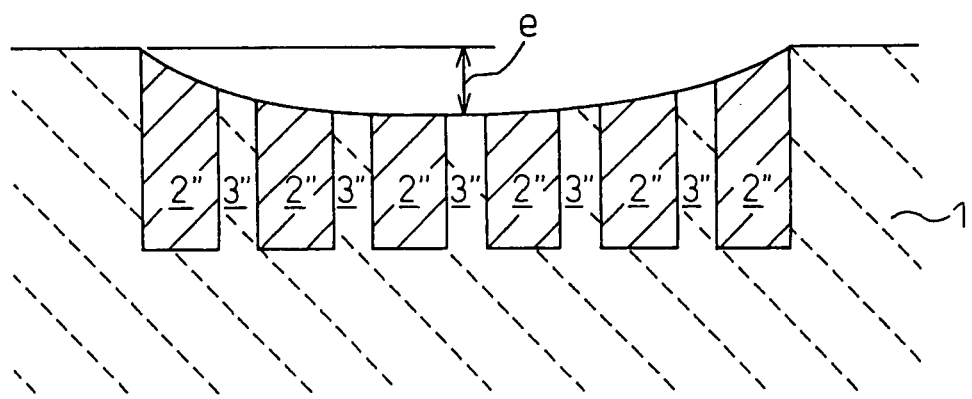
FIG. 3 is a transverse cross-sectional view showing erosion of a wafer.

Incidentally, all samples were used by cutting the substrate into a size of 4×4 cm.
<Polishing Conditions>
The polishing conditions used for the polishing of the wafer are as follows.
Wafer dimension: 4×4 cm
Linear velocity: 70 m/min
Polishing pad: IC1400 produced by Rodel Nitta Company
Polishing composition feed-rate: 13 ml/min
Polishing pressure: 15 kPa
<Evaluation of Polishing Characteristics>
The polishing characteristics were measured as follows.
Cu and Ta Removal rates:
The thickness of each of the copper film and the tantalum film before and after polishing was determined from the sheet resistance value of the film, and the removal rate was calculated from the determined value and the polishing time.
Silicon Oxide Removal Rate:
The thickness of the silicon oxide film before and after polishing was determined by using an optical interference-type thickness meter, and the removal rate was calculated from the determined value and the polishing time.
Evaluation of Dishing:
The blanket wafer with a tantalum film was polished by using each polishing solution of Examples and Comparative Example, and after determining the tantalum removal rate, the polishing time necessary for polishing 25 nm-thick tantalum was calculated. The substrate sample (FIG. 1(b)) in which the tantalum barrier film was exposed was polished (FIG. 1(c)) by using each polishing solution of Examples and Comparative Examples for 30 seconds in addition to the time period calculated above. As shown in FIG. 2, the step "d" between the height of a 100-μm space part 3" and the height of a 100-μm line part 2" was defined as the dishing and evaluated. The step was measured by using a probe-type step meter.
Measurement of Erosion:
The blanked wafer with a tantalum film was polished by using each polishing solution of the Examples and the Comparative Example and, after determining the tantalum removal rate, the polishing time necessary for polishing 25 nm-thick tantalum was calculated. The substrate sample (FIG. 1(b)) in which the tantalum barrier film was exposed was polished (FIG. 1(c)) by using each polishing solution of Examples and Comparative Examples for 30 seconds in addition to the time period calculated above. As shown in FIG. 3, the loss "e" of the inter-layer dielectric film in the space part at a line/space of 9 μm/1 μm was measured as the erosion. The step was measured by using a probe-type step meter.
<Formulation of Polishing Composition>
The formulations (mass %) of polishing compositions of Examples 1 to 12 and Comparative Examples 1 to 6 are shown in Table 1 below:

TABLE 1

| | | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|---|
| Abrasive | Colloidal silica A | 3 | 3 | 5 | 5 | 5 | 5 | 3 | 3 | 3 | 8 |
| Oxidizing agent | Hydrogen peroxide | 0.3 | 0.3 | 0.3 | 0.3 | 0.3 | 0.3 | 0.3 | 0.3 | 0.3 | 1 |
| Dicarboxylic acid | 3-methyladipic acid (C = 7) | 1 | | | | | | | | | 1 |
| | Pimelic acid (C = 7) | | 1 | 1 | 1 | 1 | 1 | 0.3 | 0.3 | | |
| | Sebacic acid (C = 10) | | | | | | | | | 0.05 | |
| | Tridecanedioic acid (C = 13) | | | | | | | | | | |
| | Glutaric acid (C = 5) | | | | | | | | | | |
| | Adipic acid (C = 6) | | | | | | | | | | |

TABLE 1-continued

| | | | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|---|---|
| The others | Organic acid | Methanesulfonic acid | | | 0.01 | | | | | | 0.02 | |
| | | Benzenesulfonic acid | | | | 0.01 | | | | | | |
| | | p-toluenesulfonic acid | | | | | 0.01 | | | | | |
| | | Cumenesulfonic acid | | | | | | 0.01 | | | | |
| | | Citric acid | | | | | | | | | | |
| | | Lactic acid | | | | | | | | 0.03 | | |
| | Inorganic acid | Surfuric acid | | | | | | | 0.02 | | | |
| | Base | KOH | | | | | | | | | | 0.9 |
| | | NH$_3$ | | | | | | | | | | |
| pH | | | 3.0 | 3.0 | 2.9 | 3.0 | 3.0 | 3.0 | 2.8 | 3.3 | 2.9 | 9.3 |

| | | | Ex. 11 | Ex. 12 | Comp. Ex. 1 | Comp. Ex. 2 | Comp. Ex. 3 | Comp. Ex. 4 | Comp. Ex. 5 | Comp. Ex. 6 |
|---|---|---|---|---|---|---|---|---|---|---|
| Abrasive | Colloidal silica A | | 8 | 8 | 5 | 3 | 8 | 3 | 3 | 5 |
| Oxidizing agent | Hydrogen peroxide | | 1 | 1 | 0.3 | 0.3 | 1 | 0.3 | 0.3 | |
| Dicarboxylic acid | 3-methyladipic acid (C = 7) | | | | | | | | | |
| | Pimelic acid (C = 7) | | | | | | | | | |
| | Sebacic acid (C = 10) | | 1 | | | | | | | |
| | Tridecanedioic acid (C = 13) | | | 1 | | | | | | |
| | Glutaric acid (C = 5) | | | | | | | 0.6 | | |
| | Adipic acid (C = 6) | | | | | | | | 1 | |
| The others | Organic acid | Methanesulfonic acid | | | 0.05 | | | | | |
| | | Benzenesulfonic acid | | | | | | | | |
| | | p-toluenesulfonic acid | | | | | | | | |
| | | Cumenesulfonic acid | | | | | | | | |
| | | Citric acid | | | | | | 1 | | |
| | | Lactic acid | | | | 0.3 | | | | |
| | Inorganic acid | Surfuric acid | | | | | | | | |
| | Base | KOH | 0.8 | 0.8 | | | | 1 | | |
| | | NH$_3$ | | | | | | | | 0.03 |
| pH | | | 9.7 | 10.5 | 2.6 | 2.9 | 9.2 | 3.2 | 2.8 | 9.5 |

Each polishing composition according to the formulation shown in Table 1 was prepared. Incidentally, colloidal silica A had a primary particle diameter of 30 to 40 nm and a secondary particle diameter of 70 nm, and the balance of the formulation shown in Table 1 was water.

<Evaluation Results>

The results are shown in Table 2 below:

TABLE 2

| | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|
| Cu removal rate (nm/min) | 39 | 29 | 37 | 40 | 42 | 41 | 49 | 37 | 30 | 32 |
| Ta removal rate (nm/min) | 87 | 93 | 101 | 104 | 103 | 103 | 91 | 112 | 94 | 71 |
| Silicon oxide removal rate (nm/min) | 80 | 93 | 94 | 92 | 92 | 91 | 77 | 119 | 71 | 43 |
| Dishing (nm) | 18 | 13 | 16 | 16 | 18 | 19 | 20 | 12 | 10 | 10 |
| Erosion (nm) | 6 | 2 | 2 | 8 | 7 | 3 | 5 | 10 | 12 | 5 |
| Dishing + Erosion (nm) | 24 | 15 | 18 | 24 | 25 | 22 | 25 | 22 | 22 | 15 |

| | Ex. 11 | Ex. 12 | Comp. Ex. 1 | Comp. Ex. 2 | Comp. Ex. 3 | Comp. Ex. 4 | Comp. Ex. 5 | Comp. Ex. 6 |
|---|---|---|---|---|---|---|---|---|
| Cu removal rate (nm/min) | 29 | 39 | 171 | 168 | 99 | 88 | 54 | 51 |
| Ta removal rate (nm/min) | 69 | 52 | 52 | 70 | 68 | 97 | 68 | 4 |

TABLE 2-continued

| | | | | | | | | |
|---|---|---|---|---|---|---|---|---|
| Silicon oxide removal rate (nm/min) | 49 | 46 | 95 | 84 | 41 | 110 | 84 | 3 |
| Dishing (nm) | 6 | 9 | 264 | 217 | 85 | 68 | 56 | 174 |
| Erosion (nm) | 4 | 4 | 213 | 221 | 58 | 53 | 30 | 143 |
| Dishing + Erosion (nm) | 10 | 13 | 477 | 438 | 143 | 121 | 86 | 317 |

As can be seen from comparison with the polishing compositions of Comparative Examples 1 to 6, the polishing compositions of Examples 1 to 12 of the present invention comprising dicarboxylic acids having 7 to 13 carbon atoms (C=7 to 13) can achieve high-speed polishing while suppressing dishing and erosion and, in particular, can maintain the flatness of the metal film. Further, Examples 3 to 9, wherein the chemical-mechanical polishing composition comprises an additional acid, show that the removal rates for copper can be varied by addition of an additional acid such that the relative removal rates for copper, tantalum and silicon oxide are adjusted.

Particularly, the polishing compositions of Comparative Examples 4 and 5 comprising glutaric acid and adipic acid, which respectively have 5 and 6 carbon atoms (C=5 and 6), provide large dishing and erosion of copper, though the removal rates for copper are similar to those for tantalum. Further, The polishing composition of Comparative Example 6 comprising ammonium to have a basic pH rather than comprising an acid such as dicarboxylic acid provides a small removal rate for tantalum, and therefore dishing and erosion of copper occurs during the polishing of tantalum.

The invention claimed is:

1. A chemical-mechanical polishing composition, comprising an aliphatic dicarboxylic acid having 8 to 13 carbon atoms in an amount of 0.3 to 10 mass % based on the chemical-mechanical polishing composition, one or more additional acids in an amount of 0.1 mass % or less based on the chemical-mechanical polishing composition, an oxidizing agent, an abrasive and water, and having a pH of 2 to 4.

2. The chemical-mechanical polishing composition according to claim 1, wherein the dicarboxylic acid is a dicarboxylic acid which does not have an additional hydroxyl group.

3. The chemical-mechanical polishing composition according to claim 1, wherein the dicarboxylic acid is sebacic acid, tridecanedioic acid, or mixtures thereof.

4. The chemical-mechanical polishing composition according to claim 1, wherein the oxidizing agent is hydrogen peroxide.

5. The chemical-mechanical polishing composition according to claim 1, wherein the abrasive is a colloidal silica.

6. The chemical-mechanical polishing composition according to claim 1, wherein the one or more additional acids comprises at least one selected from the group consisting of a sulfonic acid, a carboxylic acid, an amino acid, sulfuric acid, a phosphoric acid, a phosphonic acid, and nitric acid.

7. The chemical-mechanical polishing composition according to claim 1, wherein the composition comprises one or more alkali metal ions.

8. The chemical-mechanical polishing composition according to claim 1, wherein the composition comprises an alkali metal ion, and exclusively comprises, as the contents other than the alkali metal ion, the dicarboxylic acid having 8 to 13 carbon atoms, the oxidizing agent, the abrasive and water.

9. The chemical-mechanical polishing composition according to claim 7, wherein the alkali metal ion is potassium ion.

10. The chemical-mechanical polishing composition according to claim 1, wherein the content of the dicarboxylic acid is from 1 to 10 mass % based on the chemical-mechanical polishing composition.

11. The chemical-mechanical polishing composition according to claim 1, wherein the content of the oxidizing agent is from 0.01 to 30 mass % based on the chemical-mechanical polishing composition.

12. The chemical-mechanical polishing composition according to claim 1, wherein the content of the abrasive is 30 mass % or less based on the chemical-mechanical polishing composition.

13. A method for polishing a substrate, wherein the method comprises planarizing a substrate by using the chemical-mechanical polishing composition according to claim 1, the substrate comprising an insulating film having a trench, a barrier film formed on the insulating film, and a wiring material film buried in the trench and covering the barrier film.

14. The polishing method according to claim 13, wherein the wiring material is copper or a copper alloy.

15. The polishing method according to claim 13, wherein the insulating film is a film of an inorganic silicon compound or an organic compound.

16. The polishing method according to claim 15, wherein the inorganic silicon compound is at least one material selected from the group consisting of $SiO_2$, SiN, SiNO, SiOC, SiCN and mixtures thereof.

17. The polishing method according to claim 13, wherein the barrier film is a film of at least one material selected from the group consisting of tantalum, a tantalum alloy, a tantalum compound and mixtures thereof.

18. A kit comprising a plurality of compositions, wherein the plurality of compositions provides the chemical-mechanical polishing composition according to claim 1 when plurality of compositions are mixed together or when plurality of compositions are mixed together and diluted with water.

19. A method for transporting or storing a chemical-mechanical polishing composition, wherein the method comprises utilizing the kit according to claim 1.

* * * * *